(12) United States Patent
Cappelletti

(10) Patent No.: US 11,227,992 B2
(45) Date of Patent: Jan. 18, 2022

(54) MEMORY CELL

(71) Applicant: STMicroelectronics S.r.l., Agrate Brianza (IT)

(72) Inventor: Paolo Giuseppe Cappelletti, Seveso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 12 days.

(21) Appl. No.: 16/883,190

(22) Filed: May 26, 2020

(65) Prior Publication Data

US 2020/0381618 A1  Dec. 3, 2020

(30) Foreign Application Priority Data

May 28, 2019 (FR) ...................... 1905663

(51) Int. Cl.
*G11C 13/00* (2006.01)
*H01L 45/00* (2006.01)

(52) U.S. Cl.
CPC ........ *H01L 45/065* (2013.01); *G11C 13/0004* (2013.01); *G11C 13/0069* (2013.01); *H01L 45/126* (2013.01); *H01L 45/144* (2013.01); *G11C 2013/008* (2013.01)

(58) Field of Classification Search
CPC ................................ G11C 13/0004

USPC ......................................... 365/163
See application file for complete search history.

(56) References Cited

U.S. PATENT DOCUMENTS 8,513,576 B2 * 8/2013 Kim .................. H01L 45/1683
219/497
2009/0261313 A1  10/2009 Lung et al.

FOREIGN PATENT DOCUMENTS

EP  2706582 A1  3/2014
WO  2008068807 A1  6/2008

OTHER PUBLICATIONS

INPI Search Report and Written Opinion for FR 1905663 dated Mar. 18, 2020 (10 pages).
Koelmans, Wabe W., et al: "Projected Phase-Change Memory Devices," Nature Communications, Sep. 3, 2015, 7 pages.

* cited by examiner

*Primary Examiner* — Jason Lappas
(74) *Attorney, Agent, or Firm* — Crowe & Dunlevy

(57) ABSTRACT

A phase-change memory cell is formed by a heater, a crystalline layer disposed above the heater, and an insulating region surrounding sidewalls of the crystalline layer. The phase-change memory cell supports programming with a least three distinct data levels based on a selective amorphization of the crystalline layer.

23 Claims, 5 Drawing Sheets

MEMORY CELL

PRIORITY CLAIM

This application claims the priority benefit of French Application for Patent No. 1905663, filed on May 28, 2019, the content of which is hereby incorporated by reference in its entirety to the maximum extent allowable by law.

TECHNICAL FIELD

The present disclosure relates generally to memory devices, and more specifically to phase-change memory cells.

BACKGROUND

Phase-change materials are materials which can switch, under the effect of heat, between a crystalline phase and an amorphous phase. Since the electric resistance of an amorphous material is significantly greater than the electric resistance of a crystalline phase of the same material, such a phenomenon is used to define two memory states, for example, logic 0 and logic 1, differentiated by the resistance measured through the phase-change material. The most common phase-change materials used for manufacturing memories are alloys made up of germanium, antimony, and tellurium.

There is a need to improve the existing phase-change memory cells in order to reliably achieve a number of memory states higher than two.

There is a need to address the drawbacks of known phase-change memory cells.

SUMMARY

One embodiment provides a phase-change memory cell, including: a heater; and a crystalline layer, located above the heater, side walls of the cell being surrounded by an insulating region.

One embodiment provides a method of writing into such cell, wherein the cell is heated, by the heater, up to a temperature sufficient to partially or totally amorphize the crystalline layer.

According to one embodiment, a resistive layer is interposed between the heater and the crystalline layer.

According to one embodiment, an electrical resistance of the cell is changed by amorphizing the crystalline layer.

According to one embodiment: a first memory state is defined by having no amorphous region covering a top surface of the resistive layer; a second memory state is defined by having an amorphous region completely covering the top surface of the resistive layer; and at least one intermediate memory state is defined by having the amorphous region partially covering the top surface of the resistive layer.

According to one embodiment, the electrical resistance of the cell increases monotonically by increasing a part of the amorphous region that covers the top surface of the resistive layer.

According to one embodiment, exactly one intermediary memory state is defined by having the amorphous region partially covering the top surface of the resistive layer.

According to one embodiment, the heater is centered with respect to the cell.

According to one embodiment, exactly two intermediary memory states are defined by having the amorphous region partially covering the top surface of the resistive layer.

According to one embodiment, the heater is offset from a center of the cell.

According to one embodiment, the crystalline layer is made of a chalcogenide alloy, GST, of germanium, antimony, and tellurium.

According to one embodiment, the crystalline layer is covered by a conductive layer.

One embodiment provides a memory device including at least one memory cell of such type.

One embodiment provides a neuromorphic chip including at least one memory device of such type.

Also disclosed herein is a phase-change memory cell including a heater, a crystalline layer located above the heater and covered by a conductive layer, a resistive layer interposed between the heater and the crystalline layer, and an insulating region surrounding side walls of the crystalline layer. A first memory state of the phase-change memory cell is defined by having an amorphous region covering a top surface of the resistive layer, and at least one further memory state is defined by having the amorphous region partially covering the top surface of the resistive layer.

An electrical resistance of to phase-change memory cell may be changed by amorphizing the crystalline layer.

An electrical resistance of the phase-change memory cell may increase monotonically as a size of a portion of the amorphous region that covers the top surface of the resistive layer increases.

Only one further memory state may be defined by the amorphous region partially covering the top surface of the resistive layer.

The crystalline layer may be formed of a chalcogenide alloy.

The chalcogenide alloy may be formed of germanium, antimony, and tellurium.

Also disclosed herein is a phase-change memory cell including a heater, a crystalline layer located above the heater, a resistive layer interposed between the heater and the crystalline layer, and an insulating region surrounding side walls of the crystalline layer. An electrical resistance of the phase-change memory cell is changed by amorphizing the crystalline layer. A first memory state of the phase-change memory cell is defined when a top surface of the resistive layer is not covered by an amorphous region of the crystalline layer. A second memory state of the phase-change memory cell is defined when the top surface of the resistive layer is completely covered by the amorphous region of the crystalline layer. Only one intermediate memory state of the phase-change memory cell is defined by the top surface of the resistive layer being partially covered by the amorphous region of the crystalline layer.

An electrical resistance of the phase-change memory cell may increase monotonically as a size of a portion of the amorphous region that covers the top surface of the resistive layer increases.

The crystalline layer may be comprised of a chalcogenide alloy.

The chalcogenide alloy may be formed of germanium, antimony, and tellurium.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
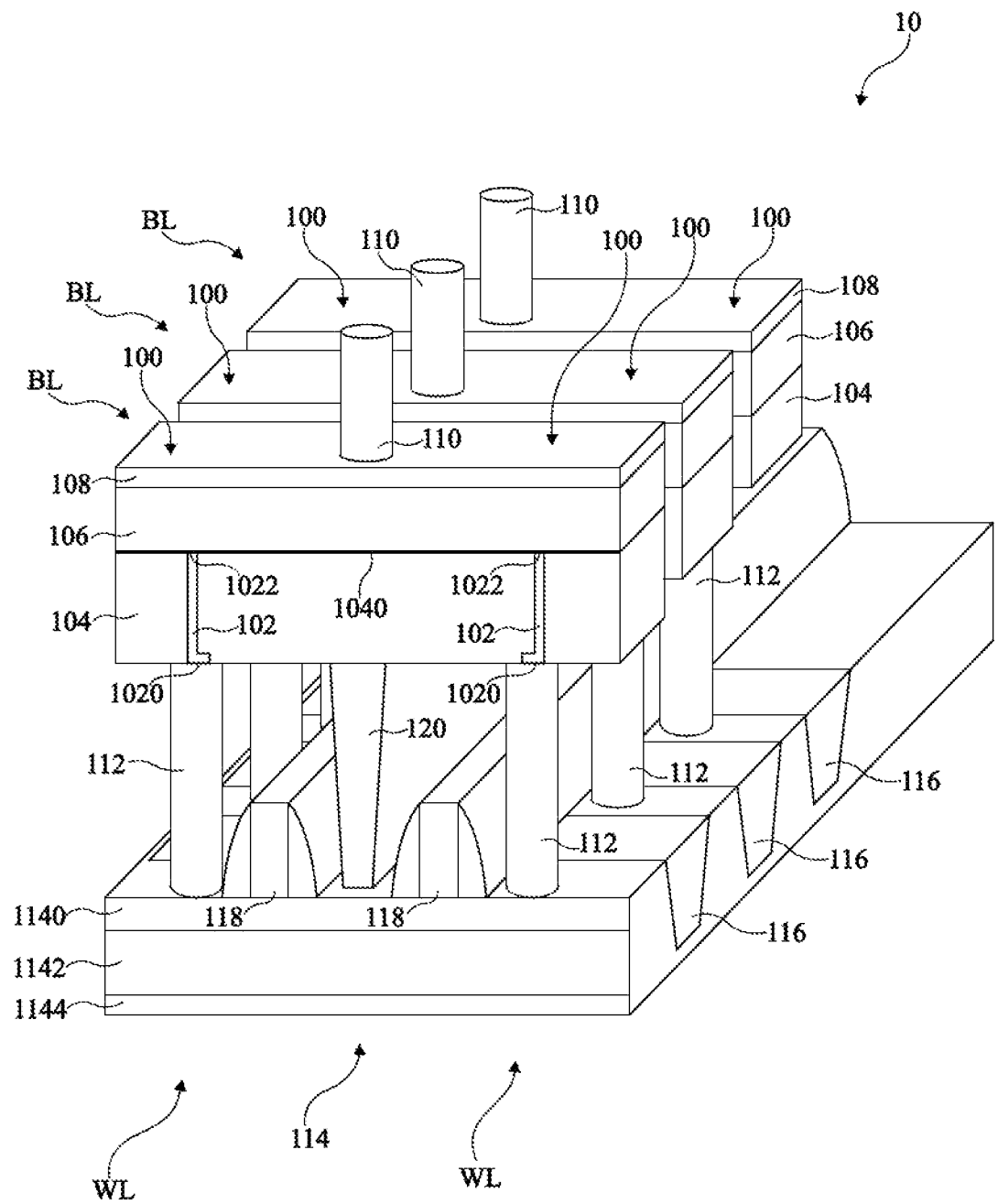
FIG. 1 is a simplified perspective view of an example of a phase-change memory device.

Like features have been designated by like references in the various figures. In particular, the structural and/or functional features that are common among the various embodiments may have the same references and may dispose identical structural, dimensional and material properties.

For the sake of clarity, the operations and elements that are useful for an understanding of the embodiments described herein have been illustrated and described in detail. In particular, the memory cells comprise elements which are not detailed, such as selection elements (transistors, for example) or electric connections.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the drawings.

Unless specified otherwise, the expressions "around", "approximately", "substantially" and "in the order of" signify within 10%, and preferably within 5%.

FIG. 1 is a simplified perspective view of an example of a phase-change memory device 10 comprising a plurality of memory cells 100.

Phase-change memory (PCM) cells, such as memory cells 100 depicted in FIG. 1, are typically embedded in non-volatile memory (NVM) devices such as electrically erasable programmable read-only memories (EEPROM). The programming of each memory cell in such memory devices is usually performed upon manufacturing of the memory devices and can afterwards be modified several times, particularly during their use.

As depicted in FIG. 1, the memory cells 100 of the memory device 10 are arranged in a grid-like or matrix pattern. In other words, the memory device 10 is comprised of an array of memory cells 100. Each memory cell 100 is located at the intersection of a row and a column of the array. In FIG. 1, only three columns BL and two rows WL are shown.

The columns BL, which are parallel to each other and parallel to the plane of FIG. 1, will further be referred to as "bit lines" (BL). The rows, which are parallel to each other and perpendicular to the bit lines, will further be referred to as "word lines" (WL).

Each phase-change memory cell 100 of the memory device 10 comprises a heater 102 or resistive element. In the example of FIG. 1, the heater 102 has an L-shaped cross-section.

The heater 102 is generally surrounded with an insulating or dielectric layer 104, which is typically comprised of nitrate and/or oxide. The thickness of this insulating layer 104 is such that the upper surface 1022 of the vertical portion of the heater 102 is coplanar with the upper surface 1040 of the insulating layer 104.

Each memory cell 100 further comprises a crystalline layer 106. This crystalline layer 106 is made of a phase-change material. The crystalline layer 106 is formed and resting both on the upper surface 1040 of the insulating layer 104 and on the upper surface 1022 of the vertical portion of the heater 102.

A conductive metallic layer 108 rests on top of the crystalline layer 106. This conductive layer 108 typically forms an electrode of the memory cell 100.

In the example of FIG. 1, the memory cells 100 belonging to a given bit line share the same insulating layer 104, the same crystalline layer 106, and the same conductive layer 108. In the memory device 10, the layers 104, 106, and 108 thus extend laterally along the BL direction (to the left and to the right, in FIG. 1). All the memory cells 100 of a given bit line are consequently sharing a common electrode 108. Conductive vias 110 are provided for connecting each electrode 108, e.g., to a metallization level located above the memory cells 100 of the memory device 10.

The heater 102 of each memory cell 100 is typically connected, by its foot 1020 (that is to say a bottom surface of its horizontal portion), to a bottom contact 112 or pillar. This bottom contact 112 extends vertically and is connected to a substrate 114.

In the example of FIG. 1, the substrate 114 has a multi-layer structure which is composed of three layers: a first layer 1140 made of a thin silicon film, to which the bottom contacts 112 are connected; a second layer 1142 made of a thin buried oxide; and a third layer 1144 comprised of a material suitable for providing mechanical support, also called "handle substrate".

The substrate 114 also features shallow trench isolation (STI) 116 between bottom contacts 112 belonging to adjacent bit lines. These shallow trench isolations 116 prevent electric current leakage between different bit lines of the memory device 10. In the memory device 10, the shallow trench isolations 116 thus extend laterally along the BL direction (to the left and to the right, in FIG. 1).

The bottom contact 112 of each memory cell 100 is connected to one terminal of a selection element. The selection element, often termed selector or access device, provides the ability to address/select individually each memory cell 100 of the memory device 10. In the example of FIG. 1, the selector of a memory cell 100 is a transistor whose gate 118 receives a bias voltage. According to its value, this bias voltage allows for enabling or disabling a current flow between the electrode 108 and a conductive region 120 connected to the other terminal of the selection element and to a common reference potential, typically a ground potential.

In the example of FIG. 1, the select transistors of memory cells 100 belonging to a given word line or row share the same gate 118. In the memory device 10, the gates 118 and the region 120 thus extend longitudinally along the WL direction (to the front and to the back, in FIG. 1). The select transistors of memory cells 100 of a given word line are consequently connected to a same gate 118.

Both the conductive layers 108 and the gates 118 hence form a matrix or grid-like pattern, in which each intersection is roughly vertically aligned with a memory cell 100.

The crystalline layer 106 happens to be natively, that is to say after manufacturing/fabricating the memory cell 100 and before the beginning of writing/programming operations, in a wholly crystalline state/phase. It is assumed, for example, that this crystalline phase corresponds to the logic value 1. In the phase-change memory 10 made of a plurality of memory cells 100, a native/initial state thus corresponds to all memory cells 100 having the same logic value 1. Data storage inside the phase-change memory 10 is then carried out by writing/programming some of its memory cells 100, while other of its memory cells 100 are left in their native state (that is to say in a crystalline state).

For writing, or programming, into a given phase-change memory cell 100 of memory 10, this memory cell 100 is first selected by applying an appropriate voltage bias to the associated gate 118. An electrical current is then flown through the crystalline layer 106 by applying an appropriate electrical potential pulse between the associated electrode 108 and the common ground region 120. The electrical potential or the intensity of this electric current is carefully tuned so as to sufficiently increase the temperature of the heater 102 to heat, by Joule heating, an area of the crystalline layer 106 in contact with the upper end 1022 of the heater 102. This causes at least part of the phase-change material, which the crystalline layer 106 is made of, to melt. If the falling edge of the potential pulse is abrupt, at the end of the pulse, the electric current flow rapidly ends and, consequently, the local temperature rapidly decreases, quenching the glassy structure of the melted part of the phase-change material. As a result, the electrical pulse has transformed a part of the phase-change material from a low resistive crystalline phase to a highly resistive amorphous state. It is assumed, for example, that this amorphous state corresponds to the logic value 0.

For reading a given phase-change memory cell 100, this memory cell 100 is first selected by applying an appropriate voltage bias to the associated gate 118. A current, whose value is low enough to avoid inadvertent phase change, is then flown through the cell 100 by applying an appropriate electrical potential between the associated electrode 108 and the common ground region 120. An electrical resistance, between the electrode 108 and the heater 102, can then be measured. This electrical resistance reflects the logic value, 0 or 1, that was previously stored in the memory cell 100.

A drawback of the memory device 10 as depicted in FIG. 1 comes from the fact that the crystalline layer 106 belongs not only to a single memory cell 100, but is instead shared by the memory cells 100 of the same bit line. This can lead to problems while programming a given memory cell 100, because of lateral heat diffusion that may disturb the amorphous state of adjacent cells of the same bit line. It can also lead to problems while reading a given memory cell 100, because alternate current pathways are easily provided by adjacent memory cells 100 of the same bit line. These problems are often referred to as "cross-talk" phenomena between adjacent memory cells.

Another drawback of the memory cell 100 depicted in FIG. 1 is that only two memory states (typically corresponding to a fully crystalline state and a fully amorphous state) can easily be achieved thanks to such cell. In other words, only one bit of information can easily be stored in a memory cell 100. This is due to the fact that possible intermediate states are not stable because they undergo a resistance drift phenomenon, which typically leads to a resistance increase over time.

According to the embodiments disclosed below, the design of memory cell 100 is modified in order to address at least part of the above-mentioned drawbacks of known phase-change memory cells.

Figure 2A:
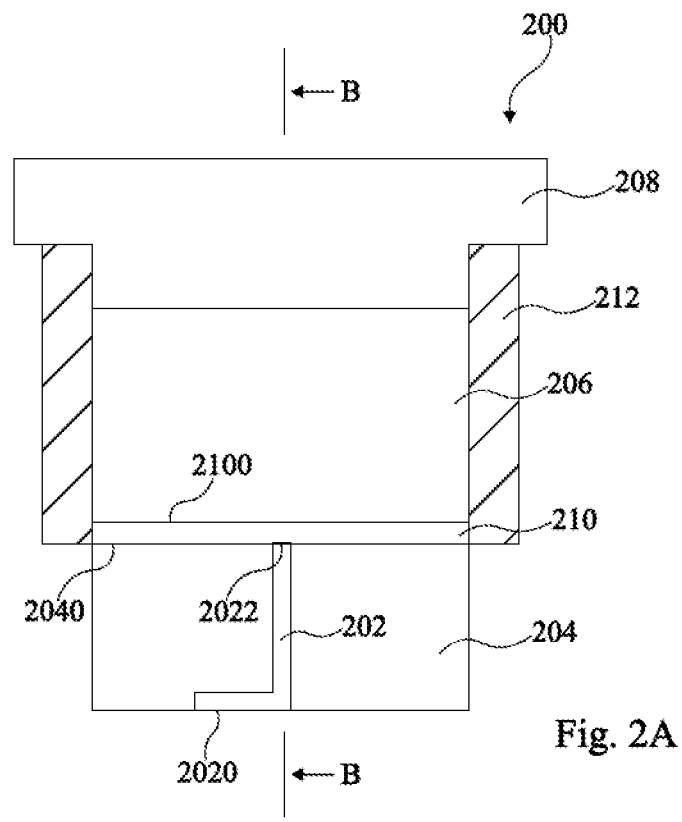
FIGS. 2A-2B show two simplified cross-section views of an embodiment of a phase-change memory cell.
Figure 2B:
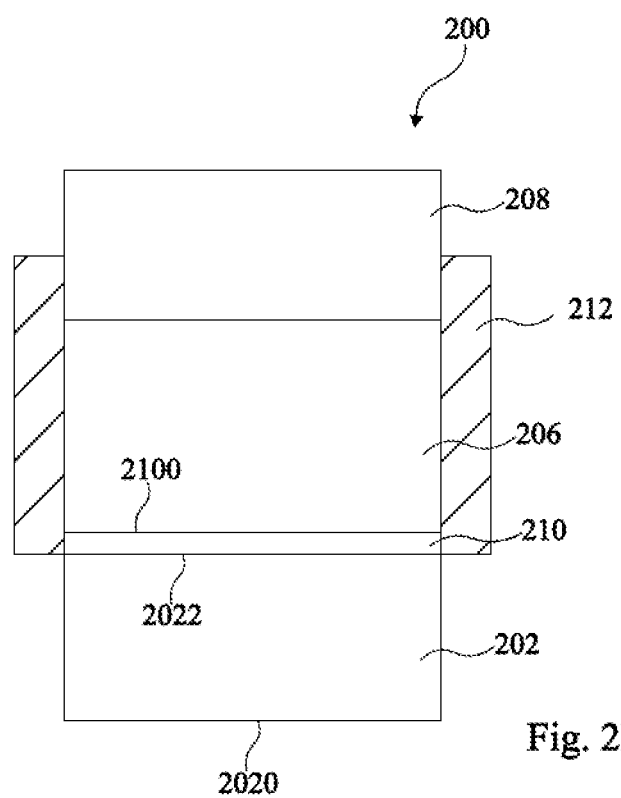

FIGS. 2A-2B show two simplified cross-section views of an embodiment of a phase-change memory cell 200.

FIG. 2B is a cross-sectional view, according to a cutting plane BB, of the memory cell 200 depicted in FIG. 2A.

The phase-change memory cell 200 comprises a heater 202 or resistive element. The heater 202 has, as shown in FIG. 2A, an L-shaped cross-section. This heater 202 is connected, by its foot 2020 (that is to say a bottom surface of its horizontal portion), to a selection element (not shown in FIGS. 2A-2B), for example, a transistor. The selection element provides the ability to address/select individually each memory cell 200 in a memory device comprising a matrix of memory cells 200.

The heater 202 is surrounded with an insulating layer 204. The thickness of this insulating layer 204 is such that the upper surface 2022 of the vertical portion of the heater 202 is coplanar with the upper surface 2040 of the insulating layer 204. The selection element (not shown in FIGS. 2A-2B) is located beneath the insulating layer 204 and contacts the foot 2020 of the heater 202.

The memory cell 200 further comprises a crystalline layer 206. This crystalline layer 206 is made of a phase-change material. The crystalline layer 206 is preferably made of a chalcogenide material, more preferably of a germanium (Ge), antimony (Sb), and tellurium (Te) alloy. Such an alloy will further be referred to as "GST".

A conductive layer 208 rests on and contacts with the crystalline layer 206. This conductive layer 208 typically forms an electrode (to be connected to the bit line) of the memory cell 200, while the heater 202 forms another electrode (to be connected to the word line) of the memory cell 200. The two electrodes are also referred to here as a "top" electrode 208 and a "bottom" electrode 202, though no limitation is implied as to memory cell 200 orientation in operation.

In the example of FIG. 2A, the top portion of the top electrode 208 extends horizontally along a direction orthogonal to the cutting plane BB. The heater 202 is preferably centered with respect to the memory cell 200.

According to an embodiment, a resistive layer 210 is interposed between the insulating layer 204 and the crystalline layer 206. In other words: the resistive layer 210 is formed and resting both on the upper surface 2040 of the insulating layer 204 and on the upper surface 2022 of the vertical portion of the heater 202, the layer 210 being in electrical contact with the heater 202; and the crystalline layer 206 is formed and resting on the upper surface 2100 of the resistive layer 210.

The resistive layer 210 is for example made of suitable refractory metal and/or suitable refractory metal nitride, such as TiN (titanium nitride), Ta (tantalum), TaN (tantalum nitride), or W (tungsten).

Side walls of the memory cell 200 are surrounded by an insulating region 212. The four lateral faces of both the crystalline layer 206 and the resistive layer 210 are, as shown in FIGS. 2A-2B, totally enclosed/wrapped by this insulating region 212, while but part of the conductive layer 208 is flanked by the insulating region 212. In a memory device (not shown in FIGS. 2A-2B) made of an array of memory cells 200, this allows for the top electrode 208 to connect the crystalline layers 206 of other memory cells 200 of a same bit line.

Due to the presence of the insulating region 212, the memory cell 200 is referred to as a "fully confined cell". In a phase-change memory array (not shown), the insulating region 212 indeed acts like a galvanic insulation as well as a thermal barrier separating adjacent cells, thus avoiding interferences between cells. The cross-talk phenomena between adjacent memory cells, which have been described with reference to FIG. 1, can theoretically not occur in a fully-confined memory cell such as the memory cell 200 depicted in FIGS. 2A-2B.

Figure 3A:
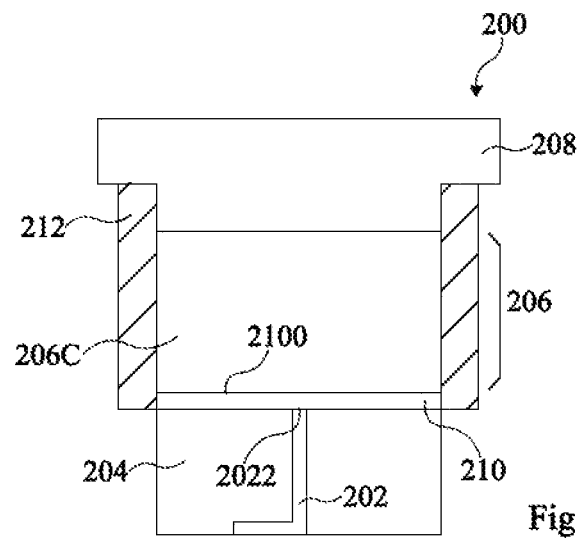
FIGS. 3A-3C show three simplified cross-sections views of various steps of a method of writing into a phase-change memory cell.
Figure 3B:
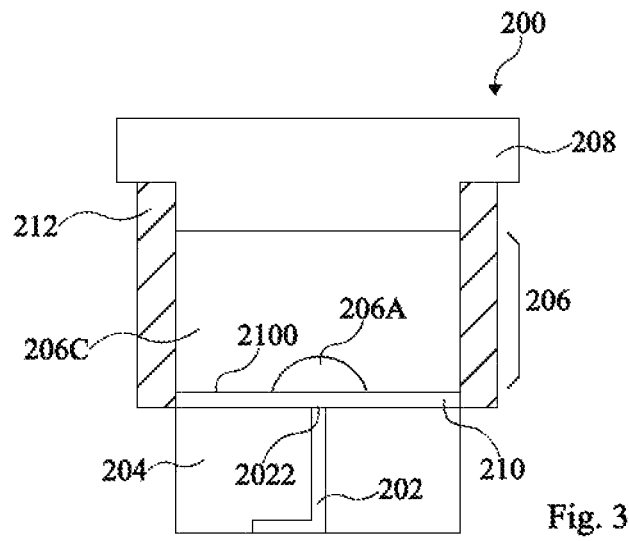
Figure 3C:
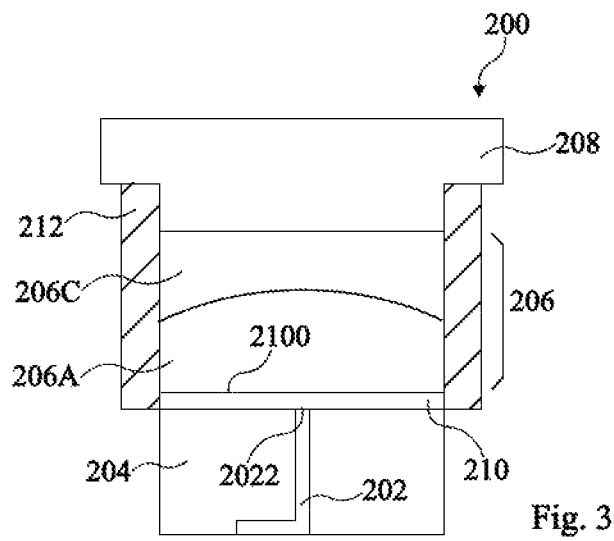

FIGS. 3A-3C show three simplified cross-sections views of various steps of a method of writing into a phase-change memory cell.

FIG. 3A depicts a PCM cell like the above-mentioned memory cell 200, whose layer 206 made of GST initially exhibits a fully crystalline phase/structure. In other words, the layer 206 is, in FIG. 3A, wholly made of a crystalline phase/region 206C. This is the case, for example, before the beginning of writing operations into the memory cell 200.

For writing in the memory cell 200, a voltage is applied between the top electrode 208 (conductive layer) and the bottom electrode 202 (heater). This voltage gives rise to an electric current flowing through the layer 206, which is initially wholly made of the crystalline phase 206C. The memory cell 200 is thus heated, by the heater 202, up to a temperature sufficient to amorphize at least part of the crystalline layer 206.

In FIG. 3B, Joule heating due to the electric current flowing through the memory cell 200 makes part of the layer 206 change phase, thereby forming an amorphous region 206A above the upper surface 2100 of the resistive layer 210. The amorphous region 206A forms a dome which is vertically aligned with the upper surface 2022 of the vertical portion of the heater 202, which is centered with respect to the memory cell 200.

In the amorphous region 206A located directly above the heater 202, the GST of which the layer 206 is made of has changed/switched phase, due to heating, from a crystalline phase to an amorphous state. The amorphous region 206A partially covers, in FIG. 3B, the upper/top surface 2100 of the resistive layer 210 (that is to say the surface of the resistive layer 210 which is in contact with the layer 206). In FIG. 3B, the layer 206 is therefore made of both the amorphous region 206A, where the phase change took place upon heating, and the crystalline phase 206C, in which the phase change did not already happen.

If a memory cell like the memory cell 200 as depicted in FIG. 3B is selected for reading and if the appropriate voltage bias is applied between the top electrode 208 and the bottom electrode 202, the electrical current flows through the crystalline region 206C and the part of resistive layer 210 covered by the amorphous region 206A. Actually, the electrical current flows through two parallel paths (not shown) so as to circumvent the amorphous region 206A. Each one of these two paths includes one of the two branches of the part of the resistive layer 210, which extend in an opposite direction from the upper surface 2022 of the heater 202, and are covered by the amorphous region 206A.

Due to the fact that the heater 202 is centered, these two paths have an equivalent electrical resistance. The resistivity and the thickness of the resistive layer 210 are such that the resistance of the memory cell 200 in the state depicted in FIG. 3B is higher than the resistance of the memory cell 200 in the state depicted in FIG. 3A. Moreover, as the resistance of the resistive layer 210 is stable over operation time, i.e., stable over time under a high temperature used for operating the cell, the cell in the state depicted in FIG. 3B is almost free from the resistance drift problem.

It is assumed that the voltage, applied between the top electrode 208 and the bottom electrode 202, is subsequently raised in order to increase the intensity of the electric current flowing through the layer 206. This results in a temperature rise inside the layer 206, thus causing the phase change to carry on within the crystalline phase 206C. Part of the crystalline GST, contained inside the crystalline region 206C, is therefore progressively converted into amorphous GST which results in an extended amorphous region 206A.

Consistently, the extent of the part of the resistive layer 210 covered by the amorphous region 206A also enlarges and its resistance increases, roughly proportionally to a length of the part of surface 2100 that is covered by the amorphous region 206A. Therefore, the resistance of the cell also increases. This enables multilevel cell programming, with analog precision and stable-over-time resistance values (no drift).

As shown in FIG. 3C, the amorphization (that is to say the process during which crystalline GST is turned into amorphous GST) can lead to a situation where the upper surface 2100 of the resistive layer 210 is fully covered by amorphous GST. In this case, the crystalline region 206C is thus completely separated from the resistive layer 210 by the amorphous region 206A. Further heating can even cause the crystalline region 206C to be completely replaced by the amorphous region 206A (that is to say a layer 206 where all the GST has been amorphized).

Thanks to the insulating region 212 surrounding the memory cell 200, all or most of the electrical conductive paths that are theoretically possible pass through the layer 206. Considering the fact that the amorphous region 206A can be less conductive (or more resistive) than the crystalline region 206C by up to several orders of magnitude, there is basically no conductive path left between the upper electrode 208 and the bottom electrode 202.

The two electrodes 202, 208 are hence fully isolated from each other thanks to the insulating region 212 and the amorphous region 206A of the GST layer 206.

Based on the fact that, as previously shown, the electrical resistance increases when the amorphous region 206A grows, three memory states of the memory cell 200 are arbitrarily defined: a first memory state is defined by having no amorphous region 206A covering the upper surface 2100 of the resistive layer 210, as depicted in FIG. 3A; a second memory state is defined by having the amorphous region 206A totally covering the upper surface 2100 of the resistive layer 210, as depicted in FIG. 3C; and an intermediate memory state is defined by having the amorphous region 206A partially covering the upper surface 2100 of the resistive layer 210, as depicted in FIG. 3B.

A number of memory states higher than two, namely three memory states as depicted in FIGS. 3A-3C, are thus advantageously achieved with the memory cell 200. This allows for a high-density storage of information in memory devices (not shown) comprising a plurality of PCM cells 200.

It is worth noting that the resistance of the memory cell 200 increases monotonically by increasing the part of the amorphous region 206A covering the top surface 2100 of the resistive layer 210. As the resistance of the state depicted in FIG. 3B can hence be modulated in an analog way by increasing the programming current, multiple logic levels, for digital memory, and/or analog storage of synaptic weights, for neuromorphic chips, may be considered for this memory state, in between the two extreme memory states depicted respectively in FIGS. 3A and 3C.

FIGS. 4A-4D show four simplified cross-section views of various steps of a method of writing into another phase-change memory cell 300.

The memory cell 300 is similar to the memory cell 200 depicted before in relation with FIGS. 2A-2B and 3A-3C, except that the heater 202 of the memory cell 300 is no longer centered but preferably offset from a center of the memory cell 300. In particular, each memory cell 300 of a memory is laterally surrounded by an insulating region 212. The heater 202 is thus offset towards one side of the memory cell 300. In FIGS. 4A-4D, the heater 202 of the memory cell 300 is shifted to the left-hand side.

Figure 4A:
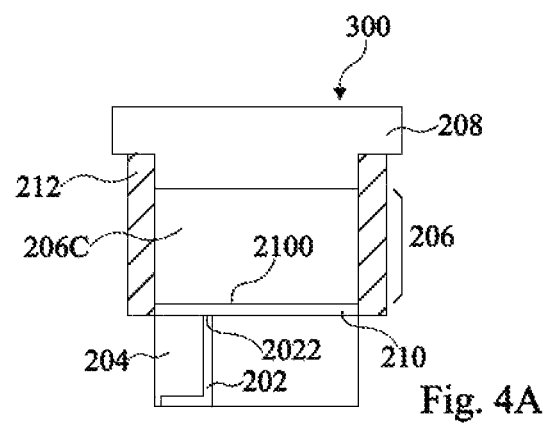
FIGS. 4A-4D show four simplified cross-section views of various steps of a method of writing into another phase-change memory cell.

FIG. 4A is similar to FIG. 3A. It depicts the PCM cell 300, whose layer 206 made of GST initially exhibits a fully crystalline phase/structure. The layer 206 is thus, in FIG. 4A, wholly made of the crystalline phase/region 206C.

Figure 4B:
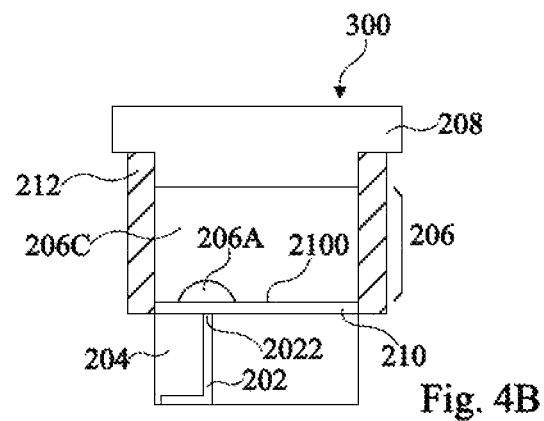

In FIG. 4B, Joule heating due to the electric current flowing through the memory cell 300 makes part of the layer 206 change phase, thereby forming an amorphous region 206A above the upper surface 2100 of the resistive layer 210. The amorphous region 206A forms a dome which is vertically aligned with the upper surface 2022 of the vertical portion of the heater 202. This dome is not centered with respect to the memory cell, as opposed to FIG. 3B.

Figure 4C:
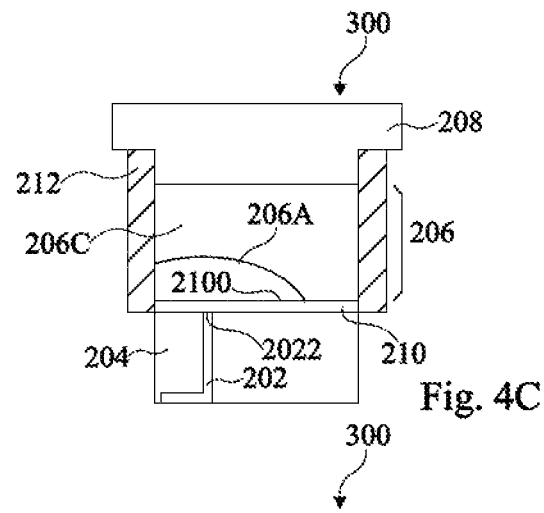

In FIG. 4C, the amorphous region 206A extends over the upper surface 2100 of the resistive layer 210 and also on at least one side wall of the GST layer 206 (on the left-hand side, in FIG. 4C). The amorphous region 206A forms a dome which partially covers the insulating region 212, thus drastically reducing the possible conductive paths compared to FIG. 4B. In FIG. 4B, two parallel branches of the part of the resistive layer 210, which extend in an opposite direction from the upper surface 2022 of the heater 202, are provided for conduction, whereas in FIG. 4C one branch is provided for conduction.

Figure 4D:
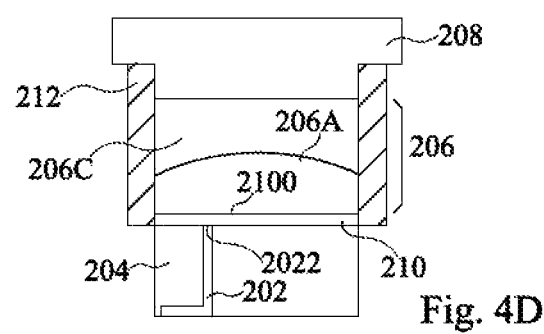

FIG. 4D is similar to FIG. 3C. The upper surface 2100 of the resistive layer 210 is fully covered by amorphous GST. In this case, the crystalline region 206C is thus completely separated from the resistive layer 210 by the amorphous region 206A. The amorphous dome formed by the amorphous region 206A is in contact with the four side walls of the GST layer 206. The top electrode 208 and the bottom electrode 202 are hence almost totally isolated from each other.

Four memory states of the memory cell 300 are arbitrarily defined: a first memory state is defined by having no amorphous region 206A covering the upper surface 2100 of the resistive layer 210, as depicted in FIG. 4A; a second memory state is defined by having the amorphous region 206A totally covering the upper surface 2100 of the resistive layer 210, as depicted in FIG. 4D; and two intermediate memory states are defined by having the amorphous region 206A partially covering the upper surface 2100 of the resistive layer 210, as depicted in FIGS. 4B and 4C.

Four memory states are thus achieved with the memory cell 300. This allows for a high-density storage of information in memory devices (not shown) comprising a plurality of PCM cells 300, where two bits of data can be stored in each PCM cell 300.

Figure 5:
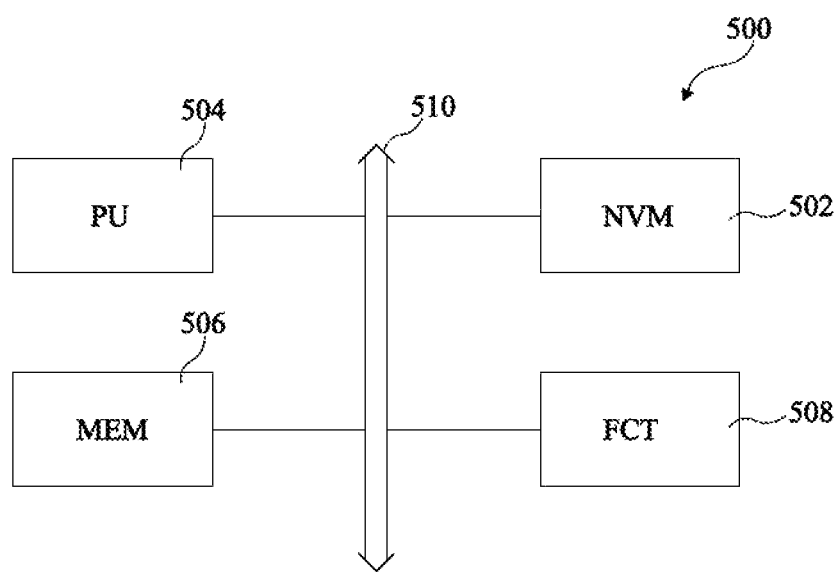
FIG. 5 schematically shows an embodiment of a memory.

FIG. 5 schematically shows an embodiment of a memory 500.

The memory 500 comprises: one or a plurality of memory devices, such as devices comprising memory cells 200 and/or 300 previously described in relation with FIGS. 3A-3C and 4A-4D, and shown in FIG. 5 by a block 502 (NVM); a data processing unit, represented by a block 504 (PU), for example, a microprocessor; one or a plurality of memory devices, represented by a block 506 (MEM), and which may be memory devices different from those of block 502; a block 508 (FCT) comprising other electronic functions, for example, sensors, load control circuits, etc.; and a data bus 510 enabling to transfer data between the different components.

The block 502 preferably includes a circuit for addressing the array of memory cells 200 and/or 300.

It is possible, for the memory devices of the block 506, not to be phase-change memory devices but to be RAMs, reprogrammable volatile memories (EEPROM, flash, etc.).

As an alternative, the block 506 may be omitted. The memory devices of the memory 500 are then memory devices such as memory devices comprising memory cells 200 and/or 300. The memory is then entirely a non-volatile memory.

Figure 6:
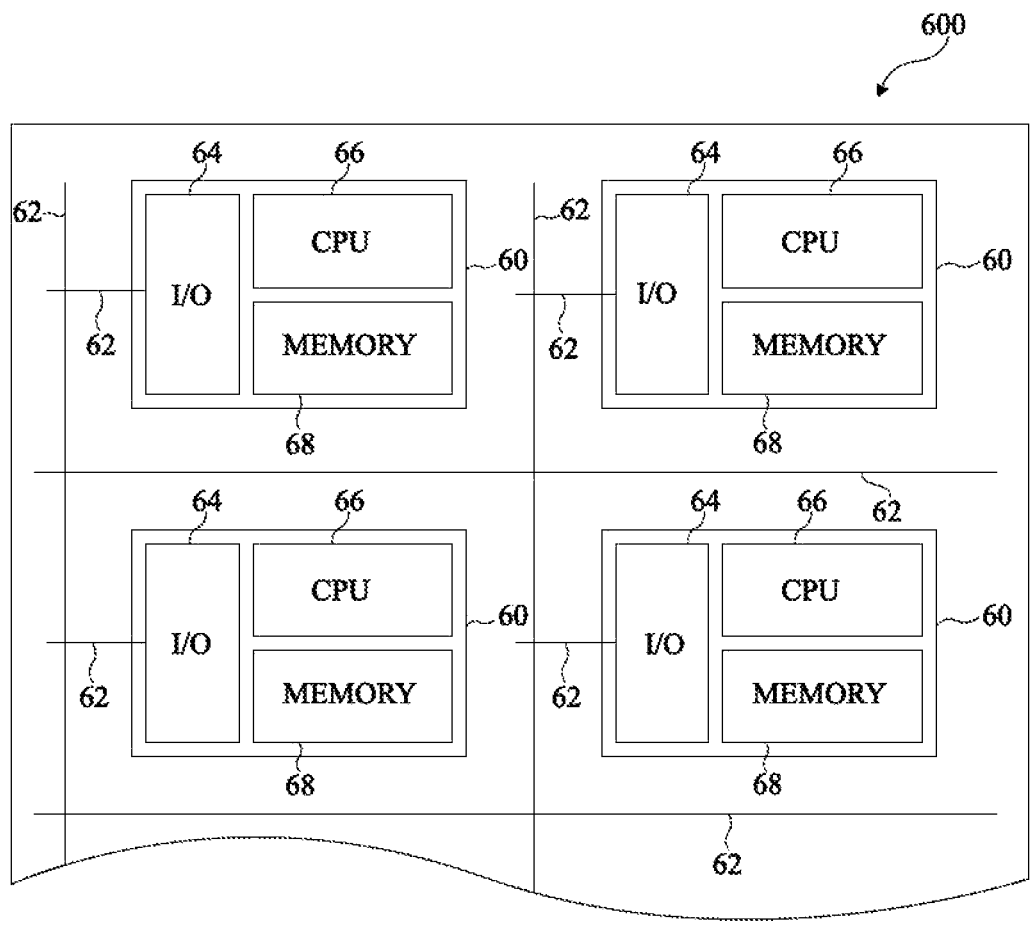
FIG. 6 schematically shows an embodiment of a neuromorphic chip.

FIG. 6 schematically shows an embodiment of a neuromorphic chip 600.

The neuromorphic chip 600 comprises an array of neuron cores 60 forming a distributed, parallel architecture. These neuron cores are linked, preferably coupled together, by one or several buses 62. The bus or buses 62 are a functional equivalent of synapses inside a brain or neural network.

Each neuron core 60 comprises: an input/output unit, represented by a block 64 (I/O), which is connected to the bus or buses 62; a central processing unit, represented by a block 66 (CPU), for example, a microprocessor; and a memory device, such as memory 500 previously described in relation with FIG. 5, and shown in FIG. 6 by a block 68 (MEMORY), or containing part of the components of memory 500, at least a memory device 502 of phase-change memory cells as described in relation with FIGS. 3 and 4.

The use of a memory device 68 comprising memory cells such as memory cells 200 and 300 allows one to improve the storage density, thus decreasing the size of each neuron core 60. This results in a smaller neuromorphic chip 600 which can therefore be more easily implemented in a circuit.

Various embodiments and variants have been described. Those skilled in the art will understand that certain features of these embodiments can be combined and other variants will readily occur to those skilled in the art. In particular, although the methods of writing described in relation with FIGS. 3A-3C and 4A-4D yield a number of respectively three and four memory states, it should be understood that a higher number of memory states could further be achieved in both cases, provided that the change in electrical resistance between these memory states is significant enough to be reliably measured.

Finally, the practical implementation of the embodiments and variants described herein is within the capabilities of those skilled in the art based on the functional description provided hereinabove.

The invention claimed is:
1. A phase-change memory cell, comprising:
a heater;
a crystalline layer located above said heater;
a resistive layer interposed between said heater and said crystalline layer; and
an insulating region surrounding side walls of the crystalline layer;

wherein:
   a first memory state of said phase-change memory cell is defined when a top surface of said resistive layer is not covered by an amorphous region of said crystalline layer;
   a second memory state of said phase-change memory cell is defined when the top surface of said resistive layer is completely covered by said amorphous region of said crystalline layer; and
   at least one intermediate memory state of said phase-change memory cell is defined by said top surface of said resistive layer being partially covered by said amorphous region of said crystalline layer.

2. The phase-change memory cell of claim 1, wherein an electrical resistance of said phase-change memory cell is changed by amorphizing said crystalline layer.

3. The phase-change memory cell of claim 1, wherein an electrical resistance of said phase-change memory cell increases monotonically as a size of a portion of the amorphous region that covers the top surface of said resistive layer increases.

4. The phase-change memory cell of claim 1, wherein only one intermediary memory state is defined by said amorphous region partially covering said top surface of said resistive layer.

5. The phase-change memory cell of claim 4, wherein said heater is centered with respect to said resistive layer.

6. The phase-change memory cell of claim 1, wherein two intermediary memory states are defined by said amorphous region partially covering said top surface of said resistive layer.

7. The phase-change memory cell of claim 6, wherein said heater is offset from a center of said resistive layer.

8. The phase-change memory cell of claim 1, wherein said crystalline layer is comprised of a chalcogenide alloy.

9. The phase-change memory cell of claim 8, wherein the chalcogenide alloy is comprised of germanium, antimony, and tellurium.

10. The phase-change memory cell of claim 1, further comprising a conductive layer covering a top surface of said crystalline layer.

11. A memory device, comprising at least one phase-change memory cell of claim 1.

12. A neuromorphic chip, comprising at least one memory device of claim 11.

13. A method for programming a phase-change memory cell by having a crystalline layer above a heater with an insulating region surrounding side walls of the crystalline layer, the method comprising:
   using said heater to selectively amorphize the crystalline layer such that:
      a first memory state of said phase-change memory cell is defined when a top surface of a resistive layer is not covered by an amorphous region of said crystalline layer;
      a second memory state of said phase-change memory cell is defined when the top surface of a resistive layer is completely covered by said amorphous region of said crystalline layer; and
      at least one intermediate memory state of said phase-change memory cell is defined by said top surface of said resistive layer being partially covered by said amorphous region of said crystalline layer.

14. A phase-change memory cell, comprising:
a heater;
a crystalline layer located above said heater and covered by a conductive layer;
a resistive layer interposed between said heater and said crystalline layer; and
an insulating region surrounding side walls of the crystalline layer;
wherein:
   a first memory state of said phase-change memory cell is defined by having an amorphous region covering a top surface of the resistive layer; and
   at least one further memory state of said phase-change memory cell is defined by having the amorphous region partially covering the top surface of the resistive layer.

15. The phase-change memory cell of claim 14, wherein an electrical resistance of said phase-change memory cell is changed by amorphizing said crystalline layer.

16. The phase-change memory cell of claim 14, wherein an electrical resistance of said phase-change memory cell increases monotonically as a size of a portion of the amorphous region that covers the top surface of said resistive layer increases.

17. The phase-change memory cell of claim 14, wherein only one further memory state of said phase-change memory cell is defined by said amorphous region partially covering said top surface of said resistive layer.

18. The phase-change memory cell of claim 14, wherein said crystalline layer is comprised of a chalcogenide alloy.

19. The phase-change memory cell of claim 18, wherein the chalcogenide alloy is comprised of germanium, antimony, and tellurium.

20. A phase-change memory cell, comprising:
a heater; and
a crystalline layer located above said heater;
a resistive layer interposed between said heater and said crystalline layer; and
an insulating region surrounding side walls of the crystalline layer;
wherein:
   an electrical resistance of the phase-change memory cell is changed by amorphizing the crystalline layer;
   a first memory state of said phase-change memory cell is defined when a top surface of said resistive layer is not covered by an amorphous region of said crystalline layer; and
   a second memory state of said phase-change memory cell is defined when the top surface of said resistive layer is completely covered by said amorphous region of said crystalline layer;
   wherein only one intermediate memory state of said phase-change memory cell is defined by said top surface of said resistive layer being partially covered by said amorphous region of said crystalline layer.

21. The phase-change memory cell of claim 20, wherein an electrical resistance of said phase-change memory cell increases monotonically as a size of a portion of the amorphous region that covers the top surface of said resistive layer increases.

22. The phase-change memory cell of claim 20, wherein said crystalline layer is comprised of a chalcogenide alloy.

23. The phase-change memory cell of claim 22, wherein the chalcogenide alloy is comprised of germanium, antimony, and tellurium.

* * * * *